(12) United States Patent
Lin et al.

(10) Patent No.: US 10,847,465 B2
(45) Date of Patent: Nov. 24, 2020

(54) SEMICONDUCTOR DEVICE AND METHOD TO FABRICATE THE SEMICONDUCTOR DEVICE

(71) Applicant: United Microelectronics Corp., Hsinchu (TW)

(72) Inventors: Da-Jun Lin, Kaohsiung (TW); Bin-Siang Tsai, Changhua County (TW); San-Fu Lin, Pingtung County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/833,713

(22) Filed: Mar. 30, 2020

(65) Prior Publication Data

US 2020/0227354 A1  Jul. 16, 2020

Related U.S. Application Data

(62) Division of application No. 16/212,401, filed on Dec. 6, 2018, now Pat. No. 10,665,546.

(51) Int. Cl.
| | |
|---|---|
| *H01L 23/532* | (2006.01) |
| *H01L 23/528* | (2006.01) |
| *H01L 21/764* | (2006.01) |
| *H01L 21/768* | (2006.01) |
| *H01L 21/02* | (2006.01) |

(52) U.S. Cl.
CPC ........ *H01L 23/5329* (2013.01); *H01L 21/764* (2013.01); *H01L 21/76826* (2013.01); *H01L 23/5283* (2013.01); *H01L 21/02126* (2013.01); *H01L 21/02164* (2013.01); *H01L 21/02167* (2013.01); *H01L 21/02178* (2013.01)

(58) Field of Classification Search
CPC ............. H01L 21/764; H01L 21/76826; H01L 23/5283; H01L 23/5329
See application file for complete search history.

(56) References Cited

U.S. PATENT DOCUMENTS

| | | | |
|---|---|---|---|
| 9,343,294 B2 | 5/2016 | Chi et al. | |
| 9,349,687 B1 | 5/2016 | Gates et al. | |
| 9,390,967 B2 | 7/2016 | Lee et al. | |
| 9,711,455 B2 * | 7/2017 | Gates | H01L 21/7682 |
| 2007/0218677 A1 | 9/2007 | Engelhardt et al. | |

* cited by examiner

*Primary Examiner* — Daniel P Shook
(74) *Attorney, Agent, or Firm* — J.C. Patents

(57) ABSTRACT

A structure of semiconductor device includes a substrate, having a dielectric layer on top. At least two metal elements are formed in the dielectric layer, wherein an air gap is between adjacent two of the metal elements. A cap layer is disposed over the substrate, wherein a portion of the cap layer above the adjacent two of the metal elements has a hydrophilic surface. An inter-layer dielectric layer is disposed on the cap layer. The inter-layer dielectric layer seals the air gap between the two metal elements. The air gap remains and extends higher than a top surface of the metal elements.

10 Claims, 4 Drawing Sheets

SEMICONDUCTOR DEVICE AND METHOD TO FABRICATE THE SEMICONDUCTOR DEVICE

CROSS-REFERENCE TO RELATED APPLICATION

This application is a divisional application of and claims the priority benefit of U.S. application Ser. No. 16/212,401, filed on Dec. 6, 2018, now allowed. The entirety of the above-mentioned patent application is hereby incorporated by reference herein and made a part of this specification.

BACKGROUND

1. Field of the Invention

The present invention generally relates to semiconductor fabrication technology, and particularly to a structure of semiconductor device and method for fabricating the semiconductor device.

2. Description of Related Art

As integration of integrated circuit is significantly improved, the device size is accordingly reduced. Although the semiconductor structure can be stacked up at the vertical direction over the substrate, the area occupied the semiconductor device should be also reduced. As the device size is greatly reduced, a distance between the interconnect lines distributed at the horizontal direction is inevitably reduced as well.

As usually known, the interconnect lines are isolated by the inter-layer dielectric layer, such as oxide or nitride or the combination of multiple dielectric materials. Once the device size is reduced, the distance between the interconnect lines is then accordingly reduced. In this situation, a parasitic capacitance effect would occur between the interconnect lines and could influence the performance of the integrated circuit. As the parasitic capacitance is involved in the interconnect lines and the effect of RC constant in the integrated circuit gets large, resulting in reducing the circuit speed.

How to properly reduce the parasitic capacitance effect between adjacent interconnect elements is an issue as concerned in design.

SUMMARY OF THE INVENTION

The invention provides a structure of semiconductor device and a method for fabricating the semiconductor device, in which an air gap is formed between adjacent two of metal elements. The volume of the air gap may be effectively increased.

In an embodiment, the invention provides a structure of semiconductor device, including a substrate, having a dielectric layer on top. At least two metal elements are formed in the dielectric layer, wherein an air gap is between adjacent two of the metal elements. A cap layer is disposed over the substrate, wherein a portion of the cap layer above the adjacent two of the metal elements has a hydrophilic surface. An inter-layer dielectric layer is disposed on the cap layer. The inter-layer dielectric layer seals the air gap between the two metal elements. The air gap remains and extends higher than a top surface of the metal elements.

In an embodiment, as to the structure of semiconductor device, the inter-layer dielectric layer has a surface energy less than a surface energy at the hydrophilic surface of the cap layer.

In an embodiment, as to the structure of semiconductor device, the portion of the cap layer above the adjacent two of the metal elements is a plasma-treated cap layer to have the hydrophilic surface.

In an embodiment, as to the structure of semiconductor device, the portion of the cap layer above the adjacent two of the metal elements is a surface-energy modified cap layer to increase a surface energy.

In an embodiment, as to the structure of semiconductor device, a surface energy of the hydrophilic surface of the cap layer induces heterogeneous nucleation at an interface to the inter-layer dielectric layer.

In an embodiment, as to the structure of semiconductor device, a by-product portion of the cap layer is also on a bottom and a sidewall of the air gap.

In an embodiment, as to the structure of semiconductor device, wherein a by-product portion of the inter-layer dielectric layer is disposed on the by-product portion of the cap layer and the air gap still remains.

In an embodiment, as to the structure of semiconductor device, the cap layer is nitrogen-doped SiC (NDC), aluminum nitride, oxygen-doped SiC (ODC), or silicon oxide.

In an embodiment, as to the structure of semiconductor device, a thickness of the cap layer is less than 60 angstroms.

In an embodiment, as to the structure of semiconductor device, each of the metal elements comprises metal line or metal plug.

In an embodiment, the invention further provides a method for fabrication semiconductor device, including providing a substrate, having a dielectric layer on top. It further includes forming at least two metal elements in the dielectric layer, wherein an air gap is between adjacent two of the metal elements. A cap layer is formed over the substrate. A plasma treatment process is performed on a portion of the cap layer on adjacent two of the metal elements to have a hydrophilic surface. An inter-layer dielectric layer is formed on the cap layer, wherein the inter-layer dielectric layer seals the air gap between the adjacent two of the metal elements. The air gap remains and extends higher than a top surface of the metal elements.

In an embodiment, as to the method for fabricating semiconductor device, the inter-layer dielectric layer has a surface energy less than a surface energy at the hydrophilic surface of the cap layer.

In an embodiment, as to the method for fabricating semiconductor device, the plasma treatment is a thermal plasma with a gas comprising He, $N_2$ or $O_2$.

In an embodiment, as to the method for fabricating semiconductor device, the inter-layer dielectric layer is hydrophobic with respect to the hydrophilic surface of the cap layer.

In an embodiment, as to the method for fabricating semiconductor device, a surface energy of the cap layer at the hydrophilic surface induces heterogeneous nucleation at an interface to the inter-layer dielectric layer.

In an embodiment, as to the method for fabricating semiconductor device, a by-product portion of the cap layer is also on a bottom and a sidewall of the air gap.

In an embodiment, as to the method for fabricating semiconductor device, a by-product portion of the inter-layer dielectric layer is disposed on the by-product portion of the cap layer and the air gap still remains.

In an embodiment, as to the method for fabricating semiconductor device, the cap layer is nitrogen-doped SiC (NDC), aluminum nitride, oxygen-doped SiC (ODC), or silicon oxide.

In an embodiment, as to the method for fabricating semiconductor device, a thickness of the cap layer is less than 60 angstroms.

In an embodiment, as to the method for fabricating semiconductor device, each of the metal elements comprises metal line or metal plug.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the fabrication technology of semiconductor device. To at least reduce the parasitic capacitance effect between metal elements, such as interconnect elements, the invention takes a strategy to form an air gap between adjacent two metal elements as intended, in which the metal elements are part of interconnect structure and may include metal lines or metal plugs.

Multiple embodiments are provided for descriptions of the invention. However, the invention is not limited to the embodiments.

Figure 1:
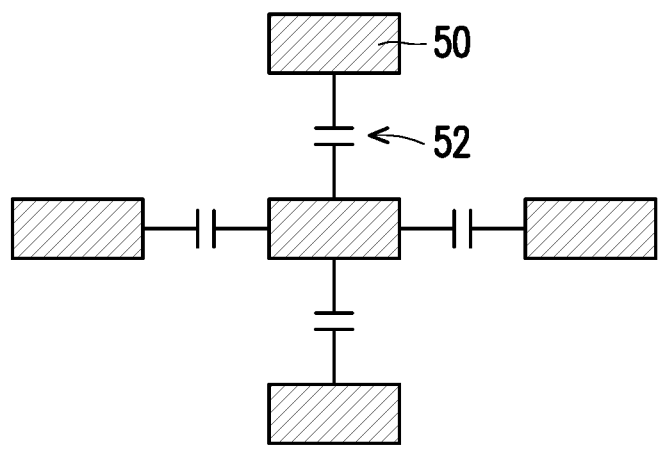
FIG. 1 is a drawing, schematically illustrating the method for fabricating an interconnect structure of semiconductor device as looked into, according to an embodiment of the invention.

The invention has looked into the issue of parasitic capacitance effect between the interconnect lines or nodes. FIG. 1 is a drawing, schematically illustrating a layout of interconnect lines with the parasitic capacitors, according to an embodiment of the invention.

Referring to FIG. 1 interconnect elements 50 are distributed as a metal layer. The interconnect elements 50 are isolated by dielectric material, formed as inter-layer dielectric layer. As previously mentioned, when the device sized is reduced, the distance between the interconnect lines 50 would be reduced, accordingly. As known, a parasitic capacitor 52 is more obviously existing between the interconnect lines 50. The parasitic capacitance is proportional to kid, wherein k is the dielectric constant of the dielectric material and d is the distance between the interconnect lines. The parameter d gets small when the size is reduced.

In the situation of reducing the distance d, the capacitance may be reduced by reducing the dielectric constant k. Air has the dielectric constant k about equal to 1. An air gap is then expected to be formed between metal elements, so to reduce the capacitance between metal elements.

Figure 2:
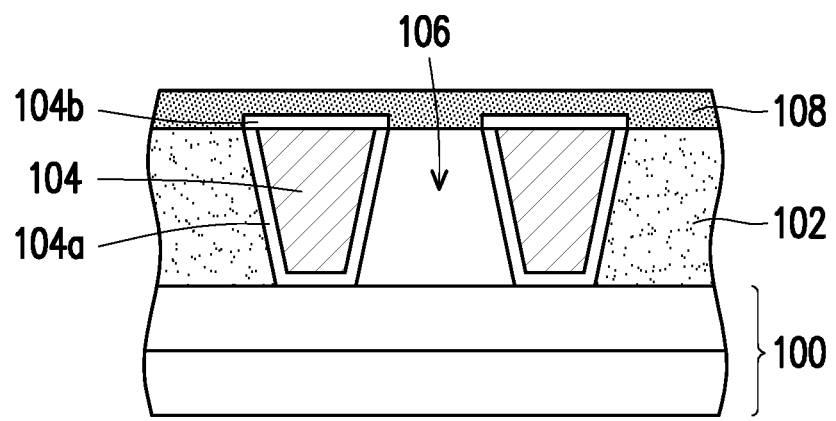
FIG. 2 is a drawing, schematically illustrating the method for fabricating an interconnect structure of semiconductor device as looked into, according to an embodiment of the invention.

FIG. 2 is a drawing, schematically illustrating the method for fabricating an interconnect structure of semiconductor device as looked into, according to an embodiment of the invention.

Referring to FIG. 2, the concept to involve the air gap to reduce the capacitance is following. A substrate in fabrication may generally include a substrate base 100 and a dielectric layer 102 on the substrate base 100. In other word, the dielectric layer 102 is a part of the substrate on top. The substrate base 100 may further includes a silicon substrate and other device layer to serve the substrate at the current fabrication level. Further, multiple metal elements 104 are formed in the dielectric layer 102. Here, the metal elements 104 may include metal plugs, metal lines, or a mix of them without specific limitation, in which the cross-section structures for the metal elements are similar.

The metal elements, such as copper elements, are usually formed by plating process. To have better quality to plating the metal as the metal element 104, a seed layer 104a may be formed first on the sidewall and the bottom of the trench or opening. The seed layer 104a may further comprises a barrier layer. In addition, a cobalt layer 104b may also be formed on the metal elements 104 to improve conductivity. However, the method to form the metal element is not just limited by the embodiments.

To reduce the capacitance between the metal elements 104, the dielectric material between adjacent metal elements 104 is removed to have an air gap 106. An etching stop layer 108 or other dielectric layer may cover over the dielectric layer 102 to seal the air gap 106. As a result, the air gap 106 exists between the adjacent two of the metal elements 104. The capacitance between the metal elements 104 is then reduced.

As known, if the volume of the air gap 106 get larger, the capacitance get smaller. The invention further provides a structure and a fabrication method to fabricate the semiconductor device.

FIGS. 3A-3F are a drawing, schematically illustrating the method for fabricating semiconductor device, according to an embodiment of the invention.

Figure 3A:
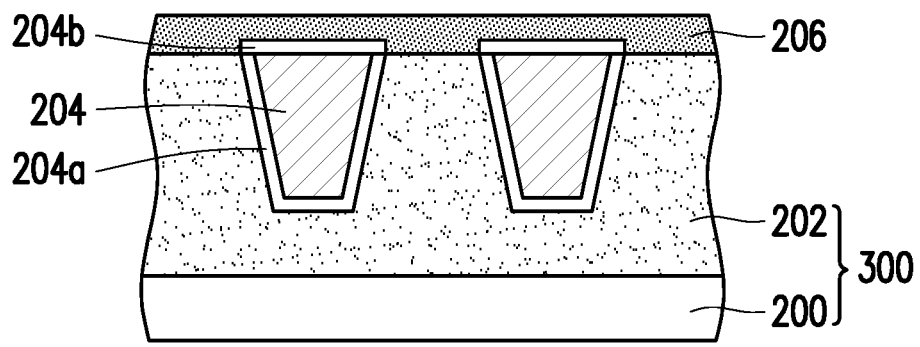
FIGS. 3A-3F are a drawing, schematically illustrating the method for fabricating semiconductor device, according to an embodiment of the invention.

Referring to FIG. 3A, a substrate 300 is provided. The substrate 300 include a substrate base 200 and a dielectric layer 202 on top, in an embodiment. As also stated in FIG. 2, in an embodiment, the dielectric layer 202 may further include an etching stop layer 206 as a part of the dielectric layer 202. The substrate base 200 may include a silicon substrate and the device layer, stacking up.

Multiple metal elements 204 are formed in the dielectric layer 202. An etching stop layer 206 of dielectric material, such as nitride, is further formed over the dielectric layer 202. The formation of the etching stop layer 206 is depending on the actual need. Actually, ion the other hand, the etching stop layer 206 can be a part of the dielectric layer 202 without specific limitation. As also previously stated, the metal elements 204 comprises plug or metal line. To perform plating process for the metal elements 204, the seed layer 204a may be included. Further, to reduce the resistance of the metal elements 204 in electric contact, a cobalt lay 204b may be also included.

Figure 3B:
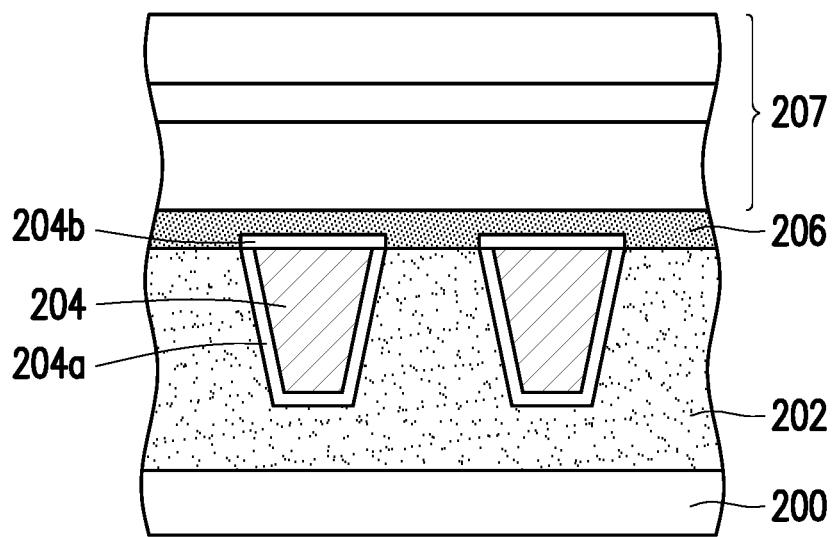
Figure 3C:
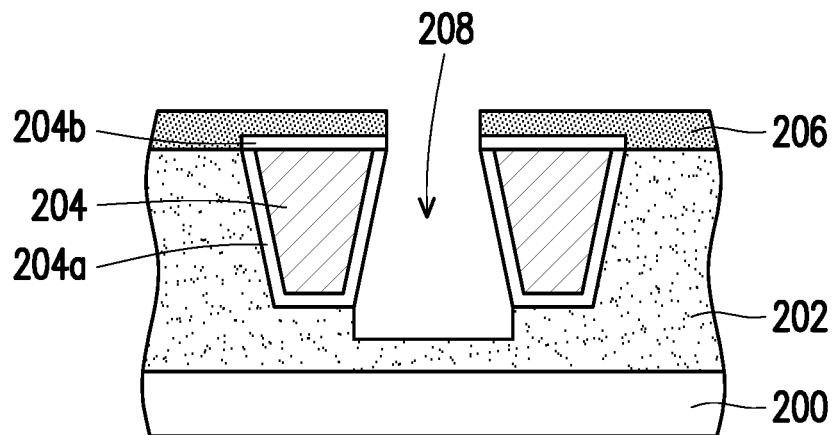

Referring to FIG. 3B, a photoresist layer 207 is formed on the etching stop layer 206. The photoresist layer 207 can be single layer or multiple layers as stacked, such as triple layers. Referring to FIG. 3C, by use of the photoresist layer 207 in photolithographic and etching process, the dielectric layer 202 with the etching stop layer 206 are patterned to have an air gap 208 between adjacent two of the metal elements.

Figure 3D:
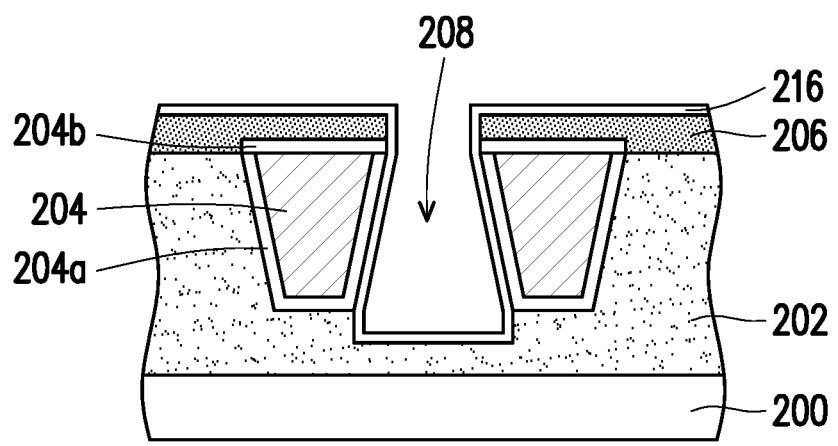

Referring to FIG. 3D, a cap layer 216 is formed conformally over the substrate 200. As a result, the sidewall and the bottom of the air gap 208 is formed to insulate the metal elements 204. The material of the cap layer 216 in an embodiment may include nitrogen-doped SiC (NDC), aluminum nitride, oxygen-doped SiC (ODC), or silicon oxide. The thickness of the cap layer 216 may be 60 angstroms or less, in an embodiment.

Figure 3E:
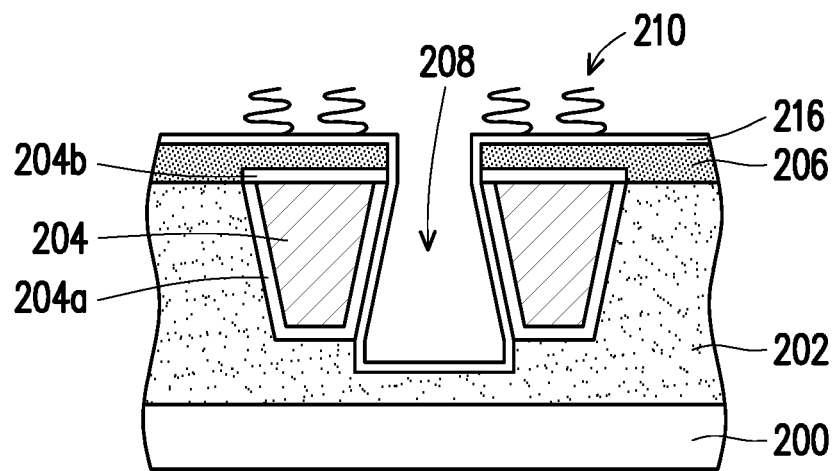

Referring to FIG. 3E, a plasma treatment process 210 is performed at least on a portion of the cap layer 216 above the metal elements 204. In an embodiment, the plasma treatment process 210 is performed at the intended part, including the peripheral region of the air gap 208. The plasma treatment process 210 is to form a hydrophilic surface on the portion of the cap layer 216 above the metal elements 204. The plasma treatment process 210 involves a gas comprising He, $N_2$ or $O_2$, in an example. In structure point of view, the plasma treatment process 210 would modify the surface energy on the portion of the cap layer 216 being treated by the plasma treatment 210, so to have larger surface energy. The cap layer 216 after the plasma treatment 210 may be changed to a surface-energy modified cap layer. However, in an embodiment, the cap layer 216 serving as a surface-energy modified cap layer may be formed by properly taking from a hydrophilic material to produce the hydrophilic surface. The hydrophilic surface would produce a clot effect when the inter-layer dielectric layer is sequentially formed over the cap layer 216.

Figure 3F:
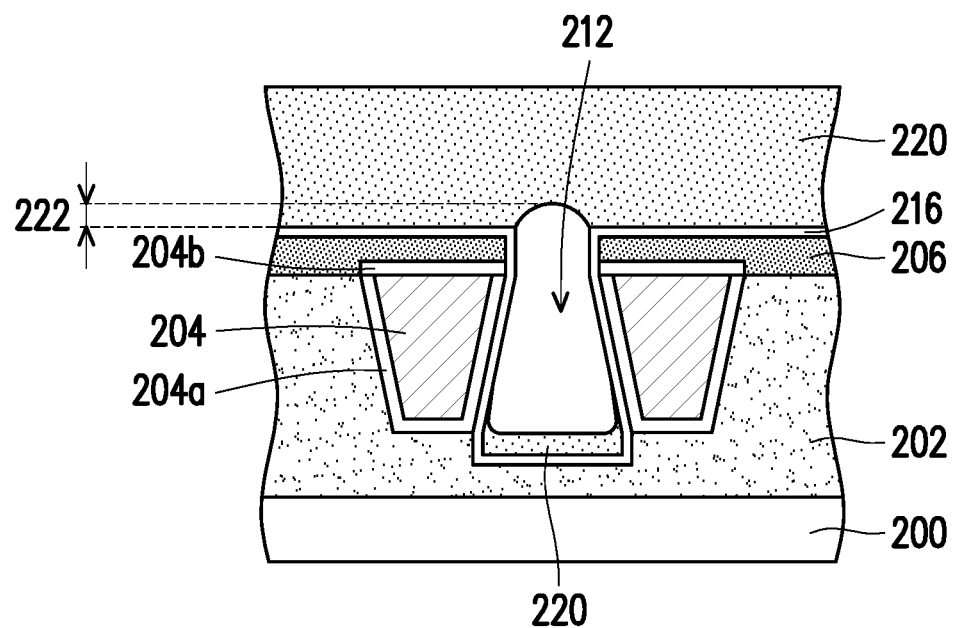

Referring to FIG. 3F, an inter-layer dielectric layer 220 are formed over the cap layer 216. Here, the inter-layer dielectric layer 220 may be a signal layer or multiple layers as a stack, depending on actual need in fabrication. The dielectric material generally has the oil-like property, which has less surface energy and tends to be the hydrophobic property. As described in FIG. 3E, the cap layer 216 is treated by the plasma treatment process 210 at the intended part, including the peripheral region of the air gap 208, resulting the creation of the hydrophilic surface. While depositing the inter-layer dielectric layer 220, the inter-layer dielectric layer 220 with the hydrophobic property is physically interacting with the cap layer 216 with the hydrophilic property. A clot effect would occur between the cap layer 216 at the portion treated by the plasma treatment process 210 and the inter-layer dielectric layer 220. As a result, when the inter-layer dielectric layer 220 is formed over the cap layer 216 to seal the air gap 208 into the air gap 212, the air gap 212 extend up by tip portion 222. On the other hand, the air gap 212 is higher than the metal elements 204. In addition, a bottom or even the sidewall of the air gap 212 may be also formed with a little of the inter-layer dielectric layer 220.

The air gap 212 with the tip portion 22 increase the air volume between the adjacent two of the metal elements 204, so the averaged dielectric constant is reduced. The parasitic capacitance between the metal elements 204 is then reduced. The RC constant is thereby reduced. The invention provides the method to form the structure with the enlarged air gap 212, in which the cap layer 216 with the hydrophilic surface is taking the effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of semiconductor device, comprising:
    a substrate, having a dielectric layer on top;
    at least two metal elements, formed in the dielectric layer, wherein an air gap is between adjacent two of the metal elements;
    a cap layer, disposed over the substrate, wherein a portion of the cap layer above the adjacent two of the metal elements has a hydrophilic surface; and
    an inter-layer dielectric layer disposed on the cap layer, wherein the inter-layer dielectric layer seals the air gap between the two metal elements,
    wherein the air gap remains and extends higher than a top surface of the metal elements.

2. The structure of semiconductor device as recited in claim 1, wherein the inter-layer dielectric layer has a surface energy less than a surface energy at the hydrophilic surface of the cap layer.

3. The structure of semiconductor device as recited in claim 1, wherein the portion of the cap layer above the adjacent two of the metal elements is a plasma-treated cap layer to have the hydrophilic surface.

4. The structure of semiconductor device as recited in claim 1, wherein the portion of the cap layer above the adjacent two of the metal elements is a surface-energy modified cap layer to increase a surface energy.

5. The structure of semiconductor device as recited in claim 1, wherein a surface energy of the hydrophilic surface of the cap layer induces heterogeneous nucleation at an interface to the inter-layer dielectric layer.

6. The structure of semiconductor device as recited in claim 1, wherein a by-product portion of the cap layer is also on a bottom and a sidewall of the air gap.

7. The structure of semiconductor device as recited in claim 6, wherein a by-product portion of the inter-layer dielectric layer is disposed on the by-product portion of the cap layer and the air gap still remains.

8. The structure of semiconductor device as recited in claim 1, wherein the cap layer is nitrogen-doped SiC (NDC), aluminum nitride, oxygen-doped SiC (ODC), or silicon oxide.

9. The structure of semiconductor device as recited in claim 1, wherein a thickness of the cap layer is less than 60 angstroms.

10. The structure of semiconductor device as recited in claim 1, wherein each of the metal elements comprises metal line or metal plug.

* * * * *